US012721127B2

(12) United States Patent
Park et al.

(10) Patent No.: US 12,721,127 B2
(45) Date of Patent: Aug. 25, 2026

(54) METHOD OF FORMING COMPOSITE MASK PATTERNS OF A SEMICONDUCTOR DEVICE

(71) Applicant: SAMSUNG ELECTRONICS CO., LTD., Suwon-si (KR)

(72) Inventors: Jisoo Park, Suwon-si (KR); Junghan Lee, Suwon-si (KR); Kwanyoung Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 429 days.

(21) Appl. No.: 18/533,635

(22) Filed: Dec. 8, 2023

(65) Prior Publication Data

US 2024/0194521 A1 Jun. 13, 2024

(30) Foreign Application Priority Data

Dec. 12, 2022 (KR) ........................ 10-2022-0173059

(51) Int. Cl.
*H10W 20/00* (2026.01)
*H10P 50/00* (2026.01)
*H10P 76/40* (2026.01)

(52) U.S. Cl.
CPC ........... *H10W 20/089* (2026.01); *H10P 50/73* (2026.01); *H10P 76/4085* (2026.01); *H10W 20/056* (2026.01); *H10W 20/062* (2026.01)

(58) Field of Classification Search
CPC .............. H10W 20/089; H10W 20/082; H10P 76/4088
See application file for complete search history.

(56) References Cited

U.S. PATENT DOCUMENTS 7,449,230 B2 11/2008 Sabnis et al.
8,389,400 B2 3/2013 Lee et al.
8,835,321 B2 9/2014 Ha
9,293,343 B2 3/2016 Lee et al.
(Continued)

FOREIGN PATENT DOCUMENTS

TW 200901370 A 1/2009
TW 201011895 A 3/2010

OTHER PUBLICATIONS

Office Action in Taiwanese Appln. No. 112148158, mailed on Dec. 17, 2025, 13 pages (with machine translation).

*Primary Examiner* — Davienne N Monbleau
*Assistant Examiner* — Emily Farmer
(74) *Attorney, Agent, or Firm* — Fish & Richardson P.C.

(57) ABSTRACT

A method of forming a pattern of a semiconductor device, the method comprising forming an insulating film on a substrate having a first region and a second region, sequentially forming a lower mask layer and an upper mask layer on the insulating film, forming a line-shaped hard mask pattern having a plurality of narrow openings having the same width in the first region and the second region, respectively, on the upper mask layer, forming line-shaped spacers on sidewalls of the opening of the line-shaped hard mask pattern, forming a composite mask pattern composed of the spacer and a pattern having a first width among the line-shaped hard mask pattern by removing a pattern having a second width among the line-shaped hard mask patterns, the second width being smaller than the first width.

20 Claims, 28 Drawing Sheets

(56) References Cited

U.S. PATENT DOCUMENTS

| | | | | |
|---|---|---|---|---|
| 9,502,428 | B1 | 11/2016 | Yonemochi | |
| 10,755,969 | B2 | 8/2020 | Chu et al. | |
| 11,205,033 | B2 | 12/2021 | Yuan et al. | |
| 2012/0252185 | A1 * | 10/2012 | Lee | H10D 89/10<br>257/E21.546 |
| 2019/0206725 | A1 * | 7/2019 | Chu | H10W 20/089 |

* cited by examiner

METHOD OF FORMING COMPOSITE MASK PATTERNS OF A SEMICONDUCTOR DEVICE

CROSS-REFERENCE TO RELATED APPLICATION

Korean Patent Application No. 10-2022-0173059, filed on Dec. 12, 2022, in the Korean Intellectual Property Office, is incorporated by reference herein in its entirety.

BACKGROUND

1. Field

A method of forming a pattern of a semiconductor device is disclosed.

2. Description of the Related Art

In manufacturing a highly scaled and highly integrated semiconductor device, it is necessary to implement fine patterns having fine widths and intervals exceeding the resolution limit of a photolithography process.

SUMMARY

Embodiments are directed to a method of forming a pattern of a semiconductor device, the method including forming an insulating film on a substrate having a first region and a second region, sequentially forming a lower mask layer and an upper mask layer on the insulating film, forming a line-shaped hard mask pattern having a plurality of narrow openings having the same width in the first region and the second region, respectively, on the upper mask layer, forming line-shaped spacers on sidewalls of the opening of the line-shaped hard mask pattern, forming a composite mask pattern composed of the spacer and a pattern having a first width among the line-shaped hard mask pattern by removing a pattern having a second width among the line-shaped hard mask patterns, the second width being smaller than the first width, forming a lower mask pattern by sequentially etching the upper mask layer and the lower mask layer using the composite mask pattern as an etch mask, etching the insulating film using the lower mask pattern as an etching mask into a line-shaped insulating pattern having the same plurality of narrow openings in each of the first region and the second region, forming a wide opening by removing a pattern having a third width among the line-shaped insulating patterns in the first region, and maintaining the plurality of narrow openings of the line-shaped insulating pattern in the second region, forming a conductive material layer filling the wide opening and the plurality of narrow openings of the line-shaped insulating pattern, and polishing the conductive material layer into a wide conductive line in the first region and a narrow conductive line in the second region.

Embodiments are directed to a method of forming a pattern of a semiconductor device, the method including forming an insulating film on a substrate, forming a lower mask layer on the insulating film, forming a line-shaped hard mask pattern having an opening on the lower mask layer, forming line-shaped spacers on sidewalls of the opening of the line-shaped hard mask pattern, forming a composite mask pattern composed of the spacer and a pattern having a first width among the line-shaped hard mask patterns by removing a pattern having a second width among the line-shaped hard mask patterns, the second width being smaller than the first width, forming a lower mask pattern by etching the lower mask layer using the composite mask pattern as an etch mask, forming a line-shaped insulating pattern with a plurality of narrow openings each having a same fourth width by etching the insulating film using the lower mask pattern as an etching mask, forming a wide opening by removing a pattern having a third width among the line-shaped insulating patterns, forming a conductive material layer filling the wide opening of the line-shaped insulating pattern, and polishing the conductive material layer into a wide conductive line.

Embodiments are directed to a method of forming a pattern of a semiconductor device, the method including forming an insulating film on a substrate, forming a lower mask layer on the insulating film, forming a line-shaped hard mask pattern having an opening on the lower mask layer, forming line-shaped spacers on sidewalls of the opening of the line-shaped hard mask pattern, forming a composite mask pattern composed of the spacer and a pattern having a first width of the line-shaped hard mask patterns by removing a pattern having a second width among the line-shaped hard mask patterns, the second width being smaller than the first width, forming a lower mask pattern by etching the lower mask layer using the composite mask pattern as an etch mask, forming a line-shaped insulating pattern having a plurality of narrow openings by etching the insulating film using the lower mask pattern as an etching mask, forming a wide opening between the plurality of narrow openings by removing a pattern having a third width among the line-shaped insulating patterns, forming a conductive material layer filling the plurality of narrow openings and the wide opening of the line-shaped insulating pattern, and polishing the conductive material layer into a conductive line having a bent portion at a location of the wide opening.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
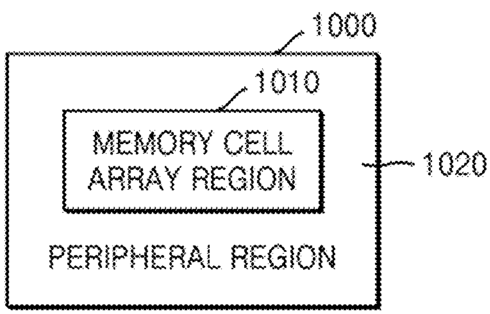
FIGS. 1A and 1B are conceptual diagrams showing an example embodiment of a semiconductor device.
Figure 1B:
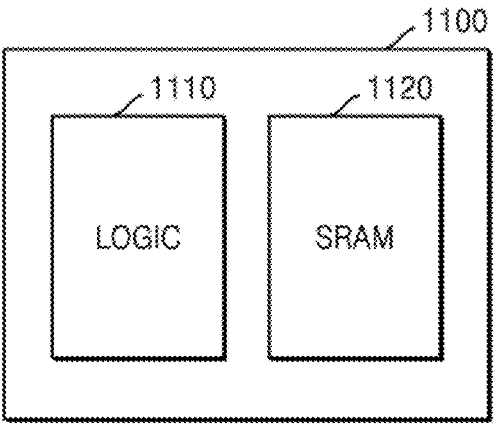

FIGS. 1A and 1B are conceptual diagrams showing an example embodiment of a semiconductor device. Referring to FIG. 1A, a semiconductor device 1000 according to an embodiment may include a memory cell array region 1010 and a peripheral region 1020 around the memory cell array region 1010.

A memory device may be in the memory cell array region 1010. The memory device may be, e.g., static random access memory (SRAM), dynamic RAM (DRAM), magnetic RAM (MRAM), phase change RAM (PRAM), resistive RAM (RRAM), or flash memory. As used herein, the term "or" is not an exclusive term, e.g., "A or B" would include A, B, or A and B.

Circuit elements required to drive memory elements in the memory cell array region 1010 may be in the peripheral region 1020. A circuit element may be, e.g., a read circuit or a write circuit.

Referring to FIG. 1B, a semiconductor device 1100 according to another embodiment may include a logic region 1110 and an SRAM region 1120. In some embodiments, a conductive line manufactured by a method of forming a pattern of a semiconductor device to be described below may be in the logic region 1110. The logic region 1110 and the SRAM region 1120 are illustrated here as an example. A region in which a memory element other than the logic region 1110 is formed, e.g., a region in which DRAM, MRAM, PRAM, RRAM, or flash memory, is formed may be applied.

Figure 2A:
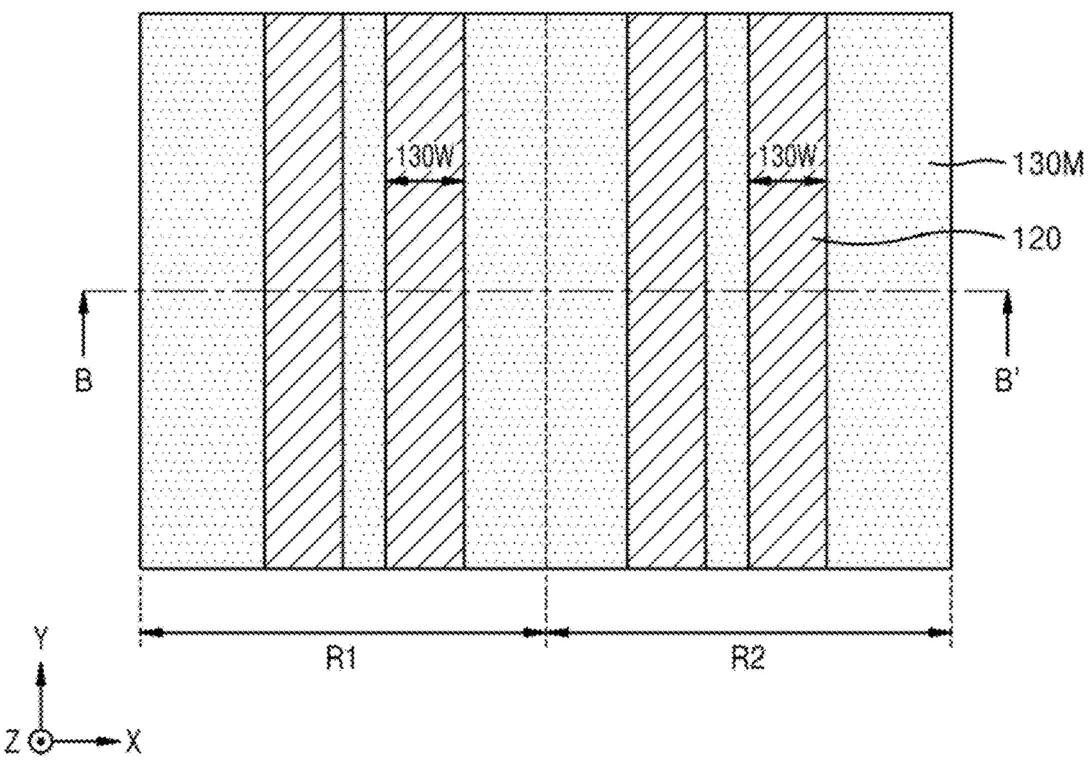
FIGS. 2A to 11B are diagrams of stages in a method of forming a pattern of a semiconductor device according to an example embodiment.

FIGS. 2A to 11B are diagrams of stages in a method of forming a pattern of a semiconductor device according to an example embodiment. In detail, FIGS. 2A-11B are plan views of stages in a method of forming a pattern of a semiconductor device. FIGS. 2A, 3A, and 11A are cross-sectional views taken along positions corresponding to lines B-B' of FIGS. 2A-11B.

In the drawings, two directions that are parallel to the upper surface of a substrate 100 and cross each other are defined as a first horizontal direction (X direction) and a second horizontal direction (Y direction), respectively. In an implementation, the first horizontal direction (X direction) and the second horizontal direction (Y direction) may substantially cross each other at right angles. In addition, a direction perpendicular to the upper surface of the substrate 100 is defined as a vertical direction (Z direction). A direction indicated by an arrow in the drawing and an opposite direction thereof are described as the same direction. The definition of such a direction is equally applied to all drawings.

Figure 2B:
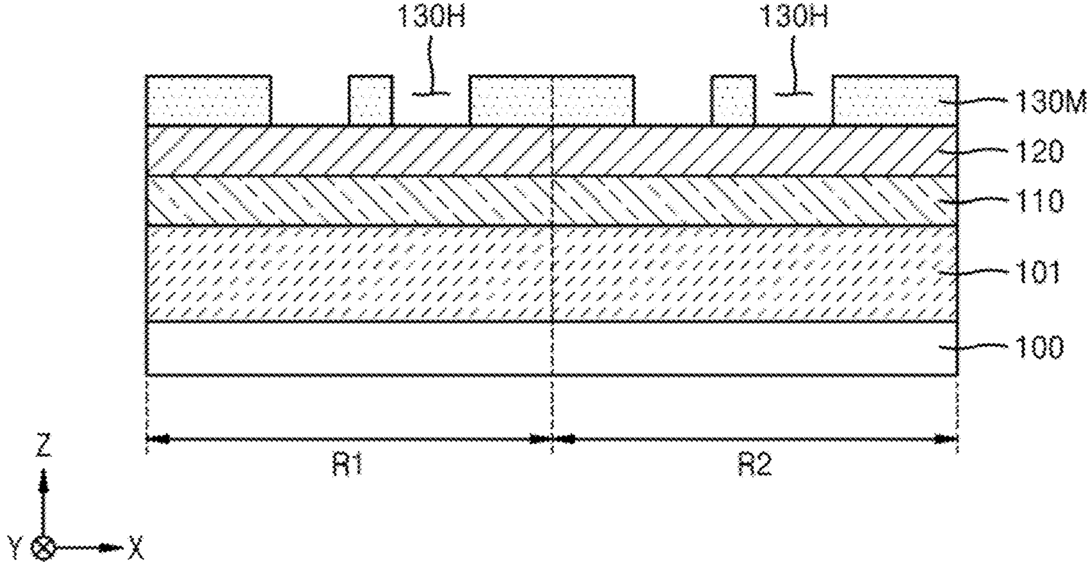

Referring to FIGS. 2A and 2B together, an insulating film 101 and a plurality of mask layers 110 and 120 may be sequentially formed on the substrate 100. The substrate 100 may include a semiconductor material, e.g., a group IV semiconductor, a group III-V compound semiconductor, or a group II-VI oxide semiconductor. In an implementation, the group IV semiconductor may include silicon, germanium, or silicon germanium. The substrate 100 may include a bulk wafer or an epitaxial layer. Alternatively, the substrate 100 may be a semiconductor substrate, such as a silicon on insulator (SOI) substrate or a gallium arsenide substrate. Unit elements necessary for forming semiconductor elements, such as various types of active elements or passive elements, may be on the substrate 100. In addition, a plurality of vias V1 and V2 (see FIG. 11B) may be in the substrate 100.

The substrate 100 may include a first region R1 and a second region R2 adjacent to each other. The first region R1 and the second region R2 may be just regions arbitrarily divided for convenience of description, and the first region R1 and the second region R2 may not be directly projected onto the semiconductor device. As described below, a wide conductive line 150M1 (see FIG. 11B) may be in the first region R1, and a narrow conductive line 150M2 (see FIG. 11B) may be in the second region R2.

The insulating film 101 may be, e.g., a silicon-based material, such as silicon oxide, silicon nitride, or silicon oxynitride. In some embodiments, the insulating film 101 may be a silicon oxide-based material. In other embodiments, the insulating film 101 may be a low dielectric layer having a dielectric constant of about 2.2 to about 3.0. The insulating film 101 may function as an interlayer insulating film surrounding a plurality of conductive lines 150M1 and 150M2 (see FIG. 11B), as described below. To do this, the insulating film 101 may be referred to as a film to be etched into a final target pattern.

The plurality of mask layers 110 and 120 may be material layers for forming a final target pattern on the insulating film 101. The plurality of mask layers 110 and 120 may be made of the same material or different materials. When the plurality of mask layers 110 and 120 are made of different materials, they may have the same or similar etch rate or different etch rates.

The plurality of mask layers 110 and 120 may include a lower mask layer 110 and an upper mask layer 120. The lower mask layer 110 may be first formed on the substrate 100, and the upper mask layer 120 may be formed later on the lower mask layer 110.

The lower mask layer 110 may include, e.g., a carbon-based material. In more detail, the lower mask layer 110 may be an amorphous carbon layer (ACL) or a spin-on hard mask (SOH) which is a film made of a hydrocarbon compound or a derivative thereof having a relatively high carbon content of about 85% by weight to about 99% by weight based on the total weight.

The upper mask layer 120 may include, e.g., plasma enhanced oxide (PEOX), tetraethyl orthosilicate (TEOS), boro TEOS (BTEOS), phosphorous TEOS (PTEOS), boro phospho TESO (BPTEOS), boro silicate glass (BSG), phospho silicate glass (PSG), or boro phospho silicate glass (BPSG).

A hard mask pattern 130M may be on the upper mask layer 120. The hard mask pattern 130M may be a material having an etching selectivity with the plurality of mask layers 110 and 120 and a preliminary spacer layer 140 (see FIG. 3A) to be formed later. The hard mask pattern 130M may be, e.g., amorphous silicon. In order to form the hard mask pattern 130M, a photoresist film may be formed, and a photo process and an etching process may be performed.

The hard mask pattern 130M may include a plurality of openings 130H. The plurality of openings 130H may extend in parallel in a second horizontal direction (Y direction) and be spaced apart from each other, wherein the openings 130H may each have the same first width 130W in the first horizontal direction (X direction). For convenience of description, only two of the plurality of openings 130H are shown in each of the first region R1 and the second region R2. There may be three or more openings 130H.

Figure 11A:
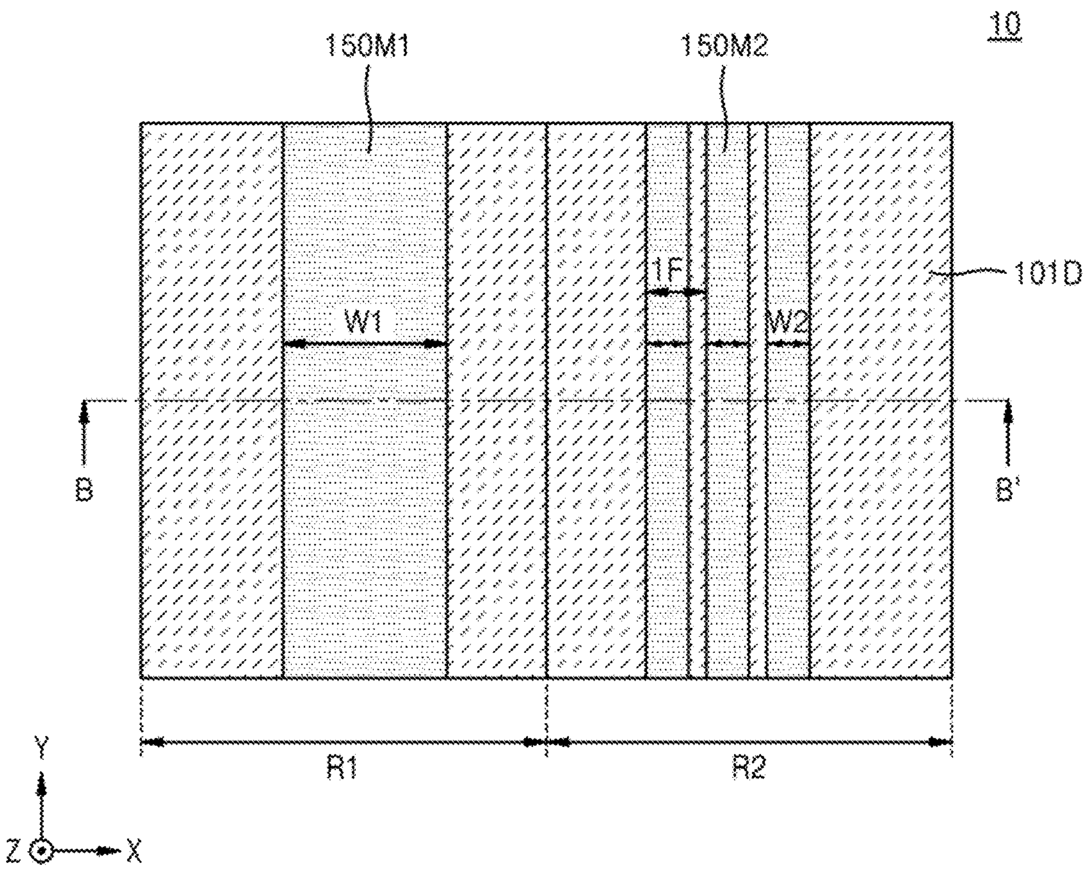

The first width 130W of the plurality of openings 130H may be greater than a line-and-space width 1F (see FIG. 11A). In an implementation, the number of openings 130H and the first width 130W may be modified based on the size and arrangement of a conductive line to be finally formed.

Figure 3A:
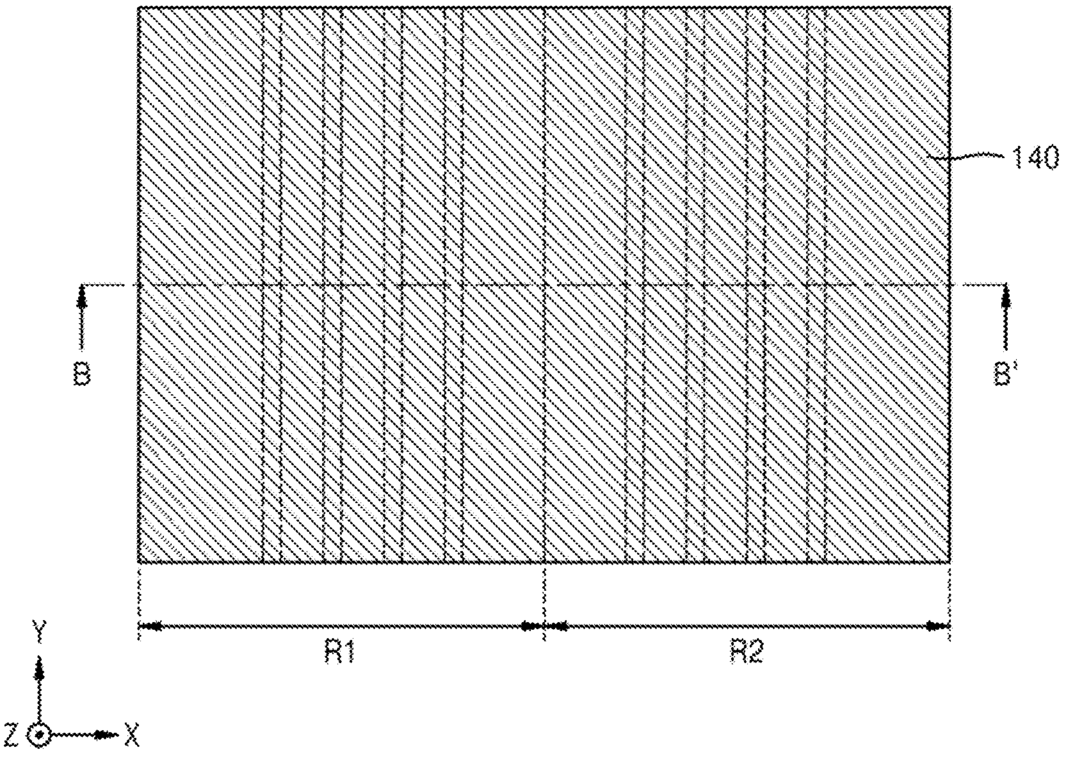
Figure 3B:
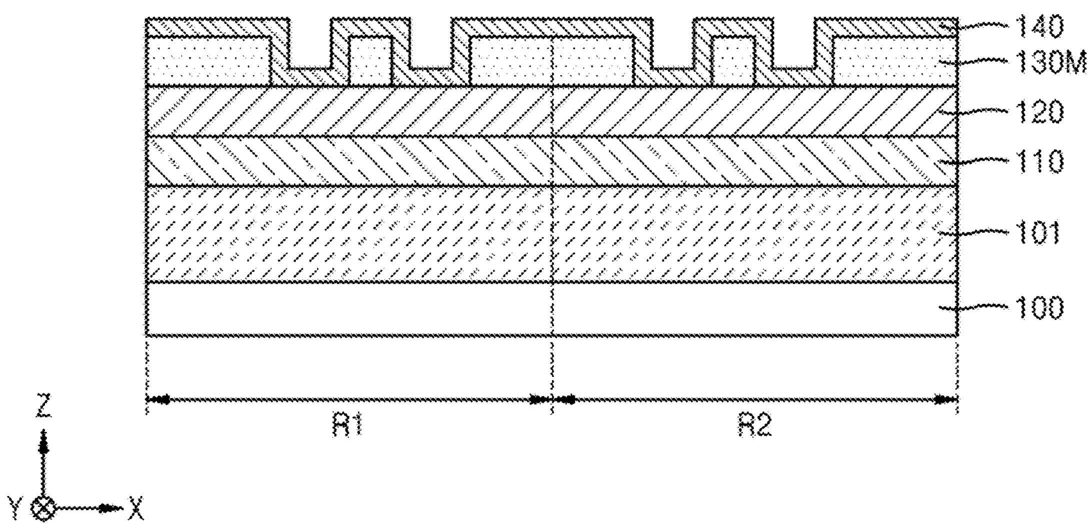

Referring to FIGS. 3A and 3B together, a preliminary spacer layer 140 may be conformally formed on the exposed surface of the upper mask layer 120 and the entire surface of the hard mask pattern 130M.

The preliminary spacer layer 140 may be formed by, e.g., a chemical vapor deposition process or an atomic layer deposition process. The preliminary spacer layer 140 may be any material having an etch selectivity with the upper mask layer 120 and the hard mask pattern 130M. In an implementation, the preliminary spacer layer 140 may be made of silicon oxide.

The thickness of the preliminary spacer layer 140 may be about ⅓ to about ⅕ of the first width 130W of the plurality of openings 130H. In an implementation, the thickness of the preliminary spacer layer 140 may be an appropriate thickness depending on the width of a spacer 140S (see FIG. 4A) formed in a subsequent process.

Figure 4A:
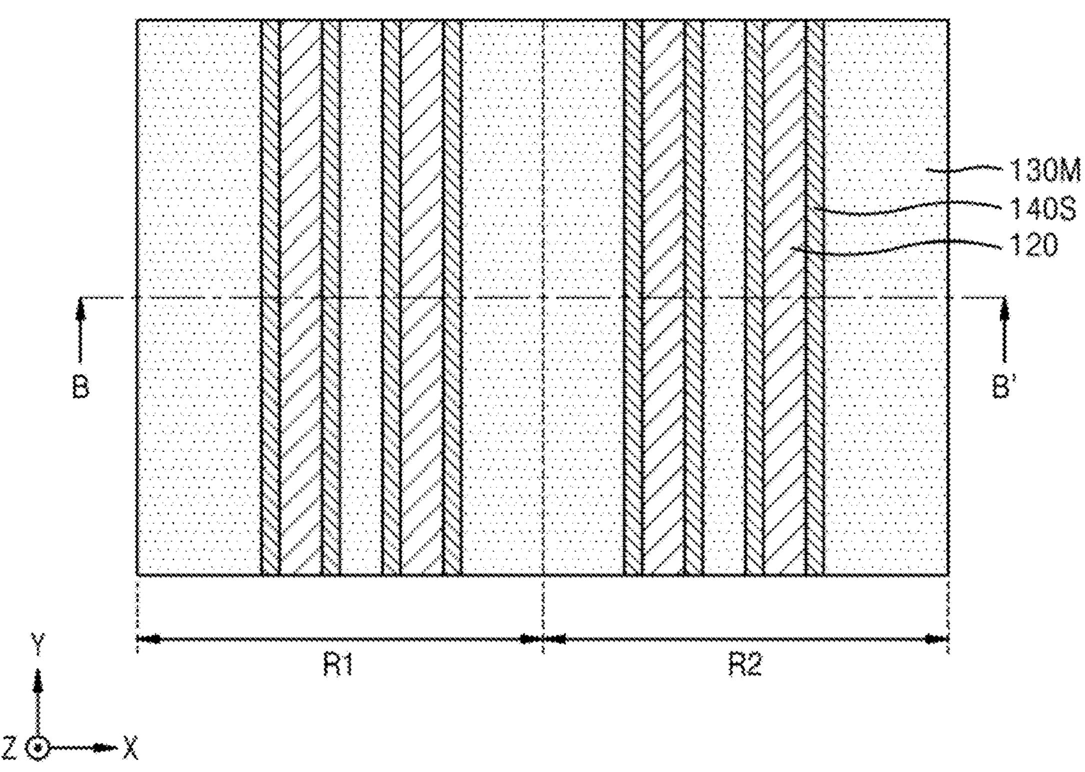
Figure 4B:
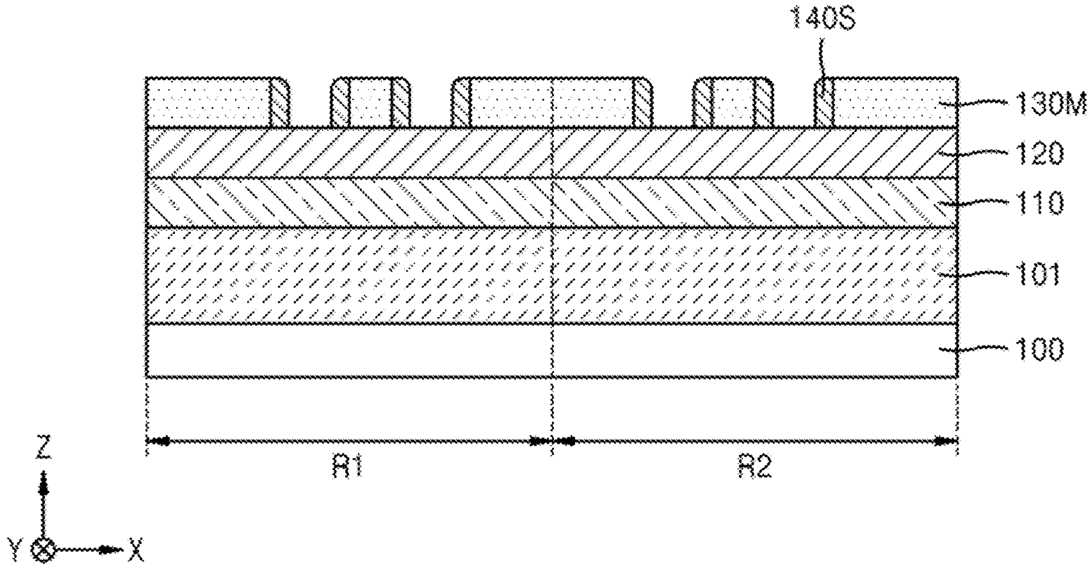

Referring to FIGS. 4A and 4B together, spacers 140S may be formed by anisotropically etching the preliminary spacer layer 140 (see FIG. 3A). To form the spacer 140S, e.g., CF gas or CHF gas may be used as a main etching gas. Alternatively, at least one gas e.g., oxygen gas or Ar may be mixed with the main etching gas.

In the process of etching the preliminary spacer layer 140 (see FIG. 3A), in some embodiments, etching may be performed in the plasma atmosphere by generating plasma of an etching gas selected from among the exemplified etching gases in an etching chamber. In other embodiments, by not generating plasma in the etching chamber, etching may be performed in the selected etching gas atmosphere without ion energy.

Figure 5A:
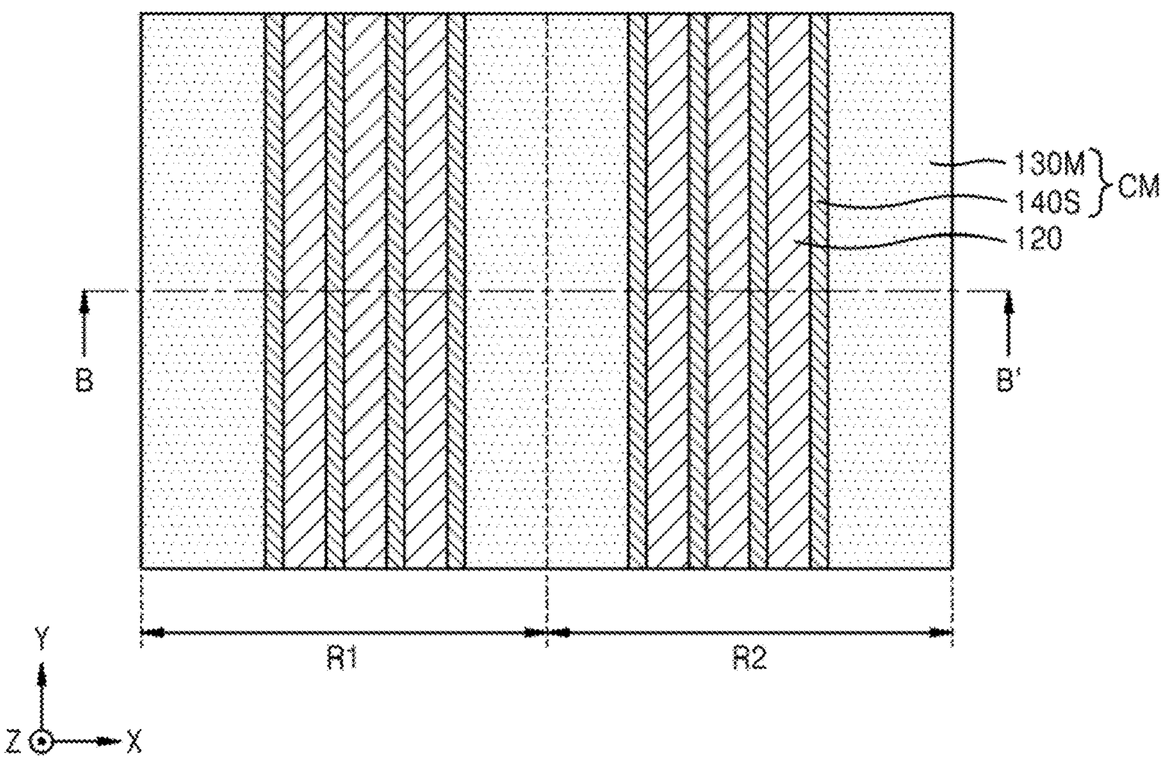
Figure 5B:
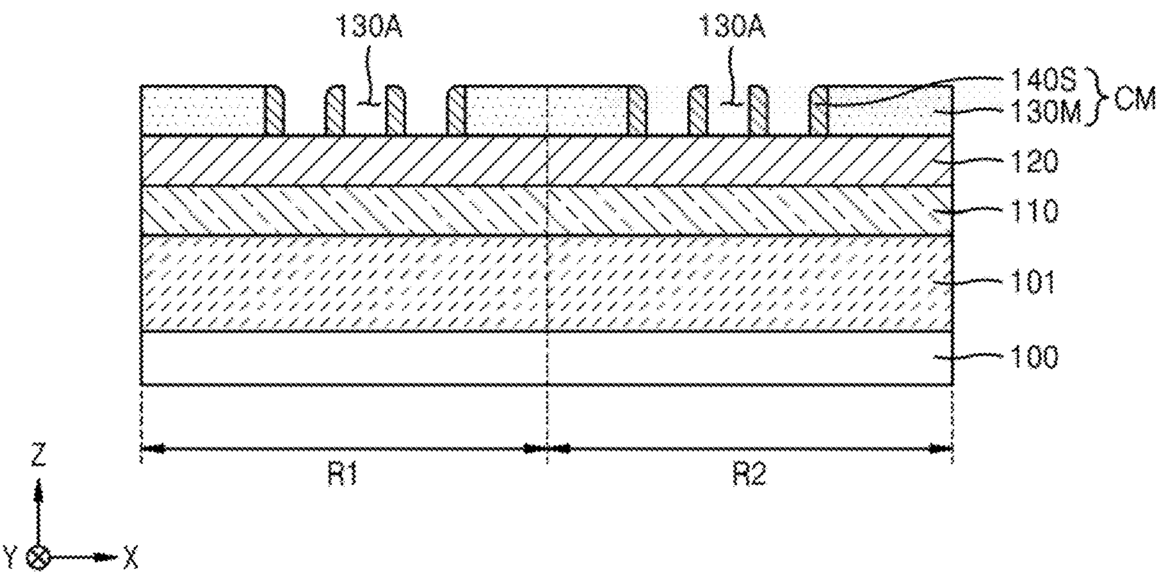

The width of the spacer 140S may be the same as the thickness of the preliminary spacer layer 140 (see FIG. 3A). In an implementation, a width of the spacer 140S may be about ⅓ to about ⅕ of the first width 130W of the plurality of openings 130H. In an implementation, the width of the spacer 140S may have a thickness formed based on the width of a conductive line. Referring to FIGS. 5A and 5B together, after forming the spacer 140S, a portion of the hard mask pattern 130M may be removed.

After forming the spacer 140S, the portion of the hard mask pattern 130M may be removed using an appropriate etching process depending on the constituent material of the hard mask pattern 130M. The removal of the portion of the hard mask pattern 130M may be performed under a condition in which etching of the spacer 140S and the upper mask layer 120 may be suppressed. Alternatively, after forming a photomask pattern on the hard mask pattern 130M, a desired portion may be etched.

A relatively narrow pattern may be removed from the hard mask pattern 130M to form an opening 130A through which the upper surface of the upper mask layer 120 may be exposed. Accordingly, a composite mask pattern CM including a relatively wide pattern among the spacer 140S and the hard mask pattern 130M may be formed. For example, as illustrated in FIG. 5B, a, e.g., the opening 130A may have a distance in an X direction (e.g., a second width) that is smaller than a distance in an X direction of the composite mask pattern CM (e.g., a first width).

In some embodiments, a relatively narrow pattern among the hard mask patterns 130M may be a pattern between the spacers 140S in each of the first region R1 and the second region R2. Accordingly, the spacer 140S may be on a sidewall of a relatively wide pattern among the hard mask patterns 130M, and the spacer 140S may be alone.

Figure 6A:
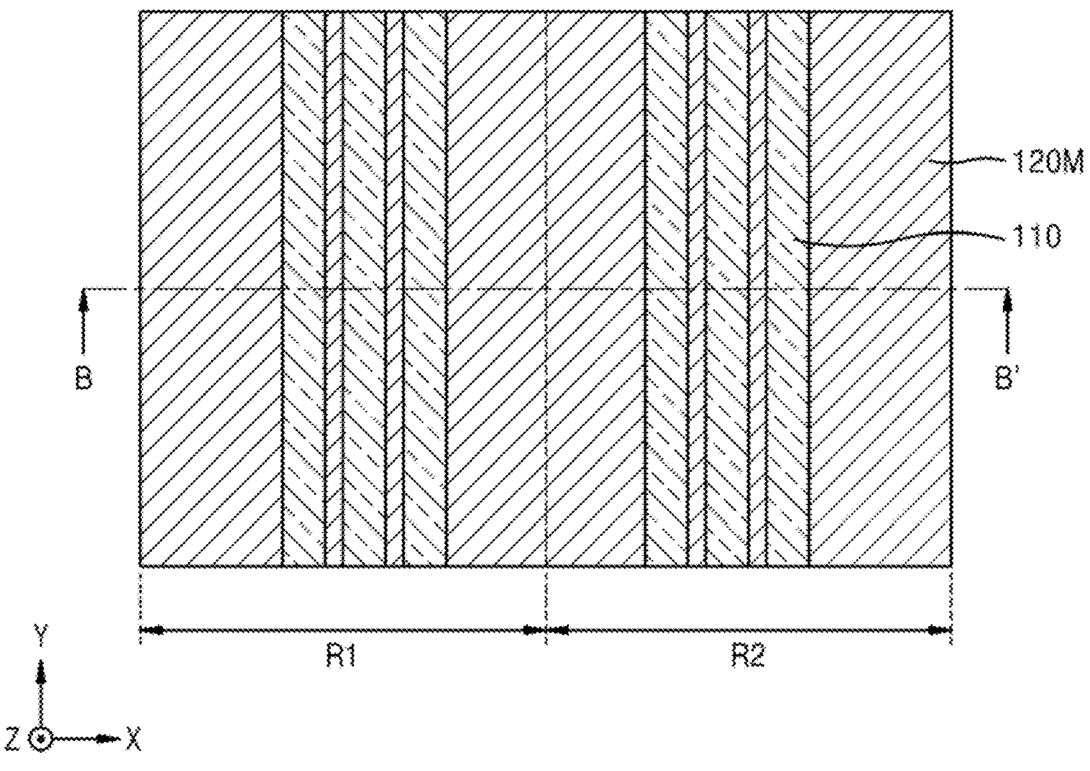
Figure 6B:
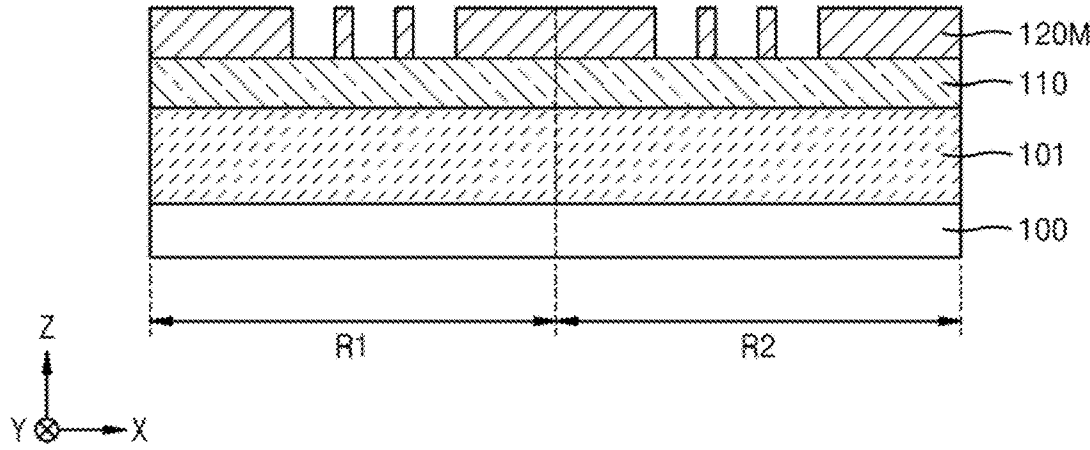

Referring to FIGS. 6A and 6B together, the upper mask pattern 120M may be formed by anisotropically etching the upper mask layer 120 using the composite mask pattern CM (see FIG. 5A) as an etch mask. As an anisotropic etching process for forming the upper mask pattern 120M, a reactive ion etching (RIE) process or an inductively coupled plasma (ICP) etching process may be used. In this case, residue of the composite mask pattern CM (shown in FIG. 5A) may remain on the upper mask pattern 120M. For subsequent processes, residue of the composite mask pattern (CM, see FIG. 5A) may be removed.

Figure 7A:
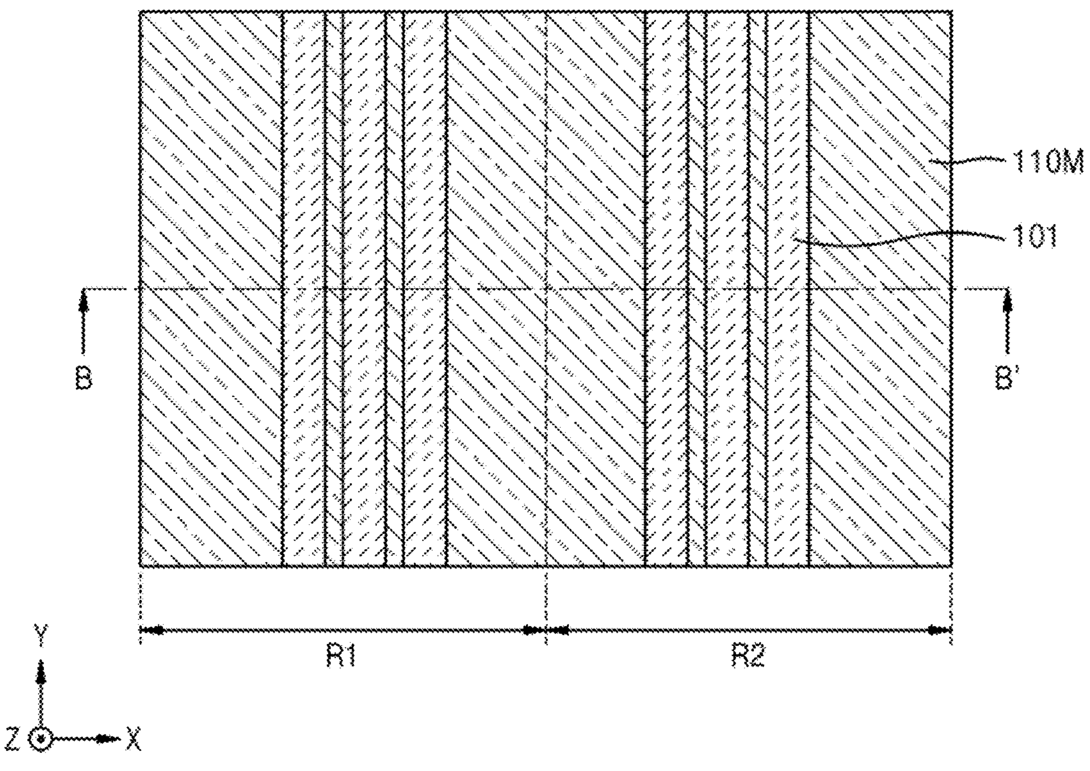
Figure 7B:
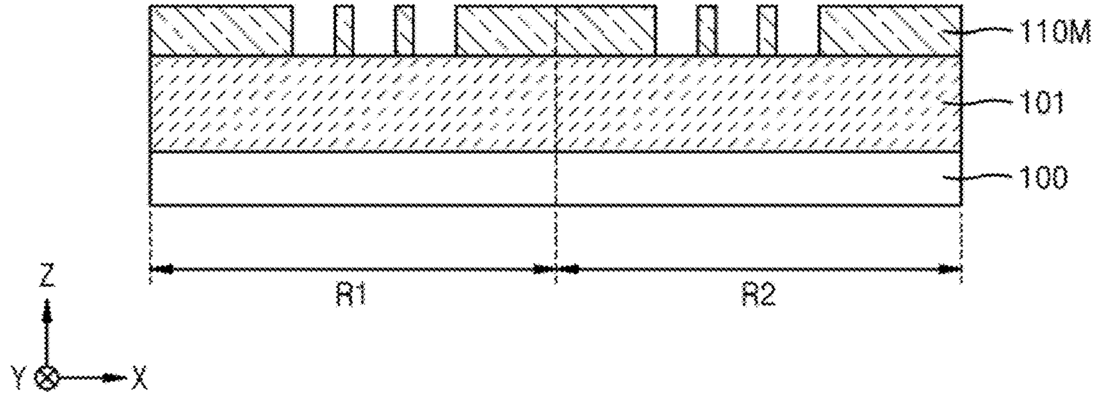

Referring to FIGS. 7A and 7B together, the lower mask pattern 110M may be formed by anisotropically etching the lower mask layer 110 using the upper mask pattern 120M (see FIG. 6A) as an etch mask. As an anisotropic etching process for forming the lower mask pattern 110M, an RIE process or an ICP etching process may be used.

In this case, residue of the upper mask pattern 120M (see FIG. 6A) may remain on the lower mask pattern 110M. For subsequent processes, residue of the upper mask pattern 120M (see FIG. 6A) may be removed. Here, although the process of forming the lower mask pattern 110M and the upper mask pattern 120M (see FIG. 6A) has been separately described, in other embodiments, the process of forming the lower mask pattern 110M and the upper mask pattern 120M (see FIG. 6A) may be performed in one process.

Figure 8A:
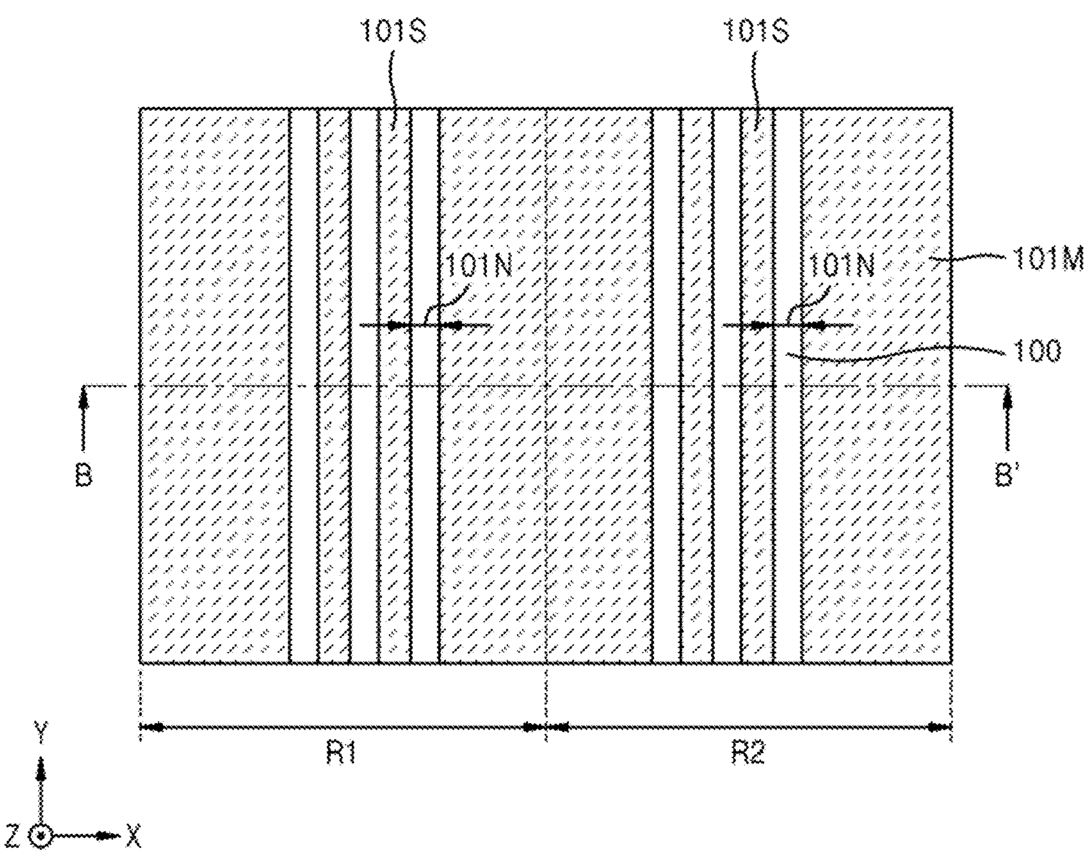
Figure 8B:
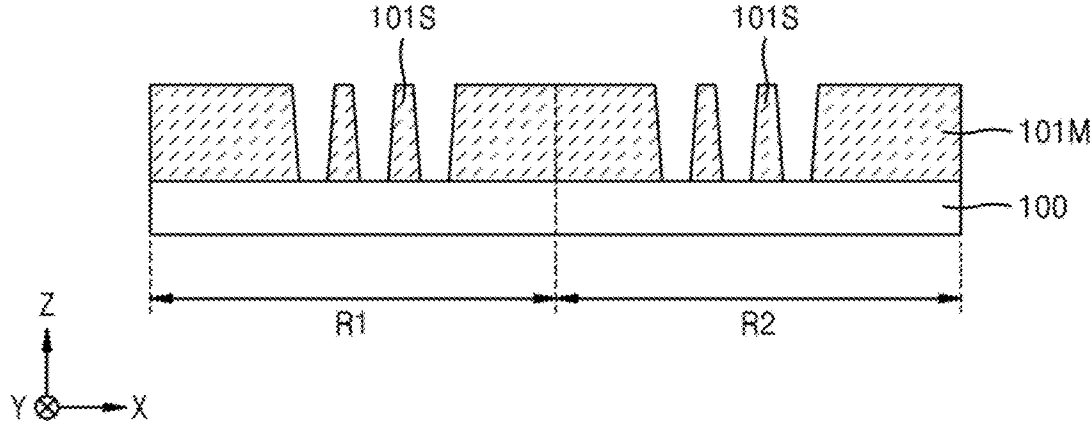

Referring to FIGS. 8A and 8B together, the insulating pattern 101M may be formed by anisotropically etching the insulating film 101, which may be a film to be etched, using the lower mask pattern 110M (see FIG. 7A) as an etching mask.

As an anisotropic etching process for forming the insulating pattern 101M, an RIE process or an ICP etching process may be used. In this case, residue of the lower mask pattern 110M (see FIG. 7A) may remain on the insulating pattern 101M. For subsequent processes, residue of the lower mask pattern 110M (see FIG. 7A) may be removed. The insulating pattern 101M may include the same narrow openings 101N in the first region R1 and the second region R2, respectively. A line-shaped insulating spacer pattern 101S extending in a second horizontal direction (Y direction) may be between the adjacent narrow openings 101N.

The narrow openings 101N may have a tapered shape in which the width thereof narrows towards the substrate 100, and on the contrary, the insulating spacer pattern 101S may have a tapered shape that widens away from the substrate 100. Such a tapered shape may be characteristic of an anisotropic etching process. In an implementation, ideally, the sidewall of the narrow opening 101N and the sidewall of the insulating spacer pattern 101S should be perpendicular to the upper surface of the substrate 100, but due to the nature of the anisotropic etching process and ultrafine process, such a vertical structure may not be implemented. Therefore, the narrow opening 101N may be as vertical as possible.

Figure 9A:
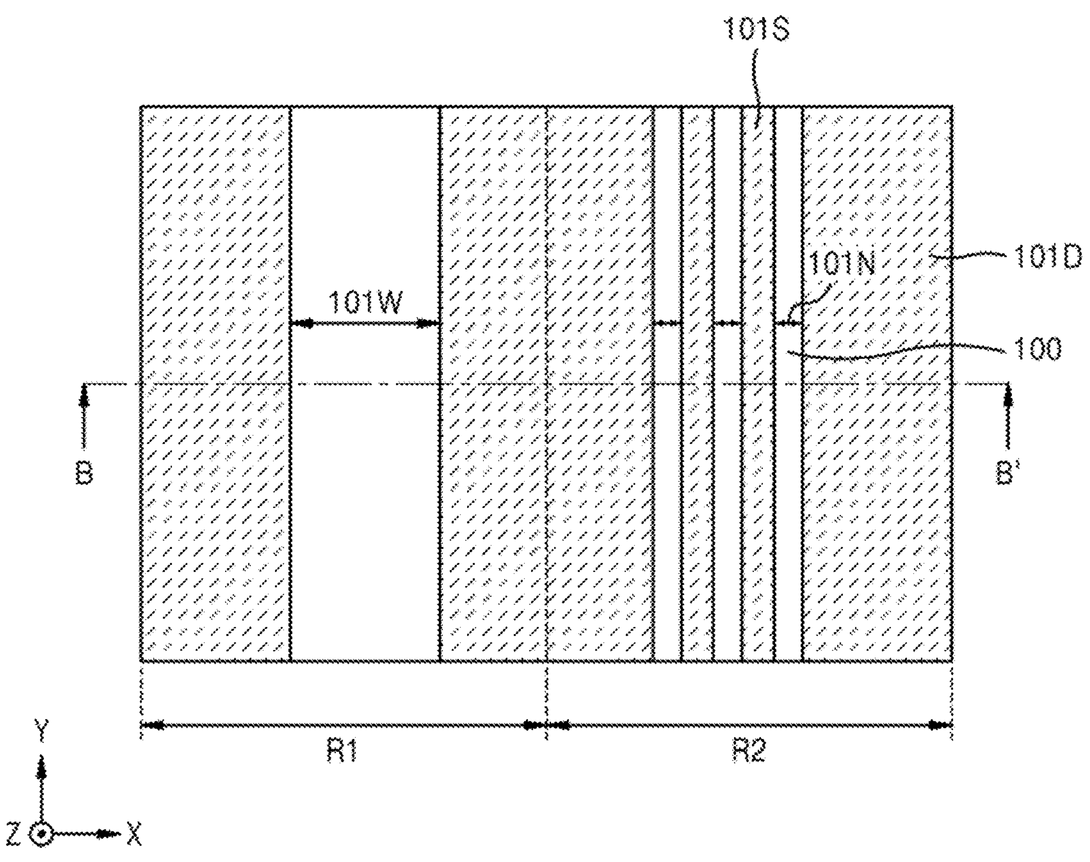
Figure 9B:
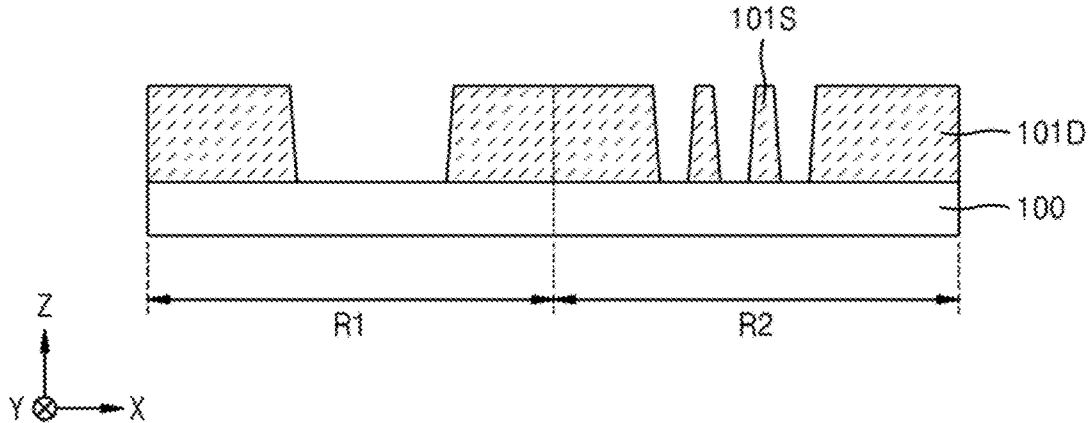

Referring to FIGS. 9A and 9B together, after forming the insulating pattern 101M (see FIG. 8A), the insulating spacer pattern 101S may be completely removed from the first region R1 to form the final insulating pattern 101D.

After the insulating pattern 101M (see FIG. 8A) is formed, a portion of the insulating spacer pattern 101S may be removed using an appropriate etching process depending on the constituent material of the insulating pattern 101M (see FIG. 8A). Part of the insulating spacer pattern 101S may be removed under a condition in which etching of the substrate 100 is suppressed. Alternatively, after forming a photomask pattern on the insulating pattern 101M (see FIG. 8A), the insulating spacer pattern 101S may be removed from the first region R1.

In the first region R1, all the insulating spacer patterns 101S may be removed to form a wide opening 101W in the first region R1. Unlike this, in the second region R2, the insulating spacer patterns 101S may be left, so that the narrow opening 101N may exist in the second region R2. The wide opening 101W may have a width that is dependent on the number of spacer patterns 101S that are removed (e.g., a third width).

In an implementation, to form the final target pattern differently for each region, the remaining number of insulating spacer patterns 101S in the first region R1 and the second region R2 may be adjusted. Accordingly, a final insulating pattern 101D having wide openings 101W and narrow openings 101N, the wide openings 101W and narrow openings 101N having different widths in the first horizontal direction (X direction), may be formed on the substrate 100. The narrow openings 101N may have the same widths (e.g., a fourth width).

Here, one sidewall (left sidewall in the drawing) of the wide opening 101W of the first region R1 corresponds to one sidewall (leftmost sidewall in the drawing) located at the outermost part among conventional narrow openings (the narrow openings 101N) (see FIG. 8A) of the first region R1. In addition, the other sidewall (right sidewall in the drawing) of the wide opening 101W of the first region R1 corresponds to the other sidewall (rightmost sidewall in the drawing) located at the outermost part among the conventional narrow openings (the narrow openings 101N) (see FIG. 8A) of the first region R1. In other words, a first sidewall may be located at a first outermost part of the plurality of narrow openings, and a second sidewall may be located at a second outermost part of the plurality of narrow openings.

Figure 10A:
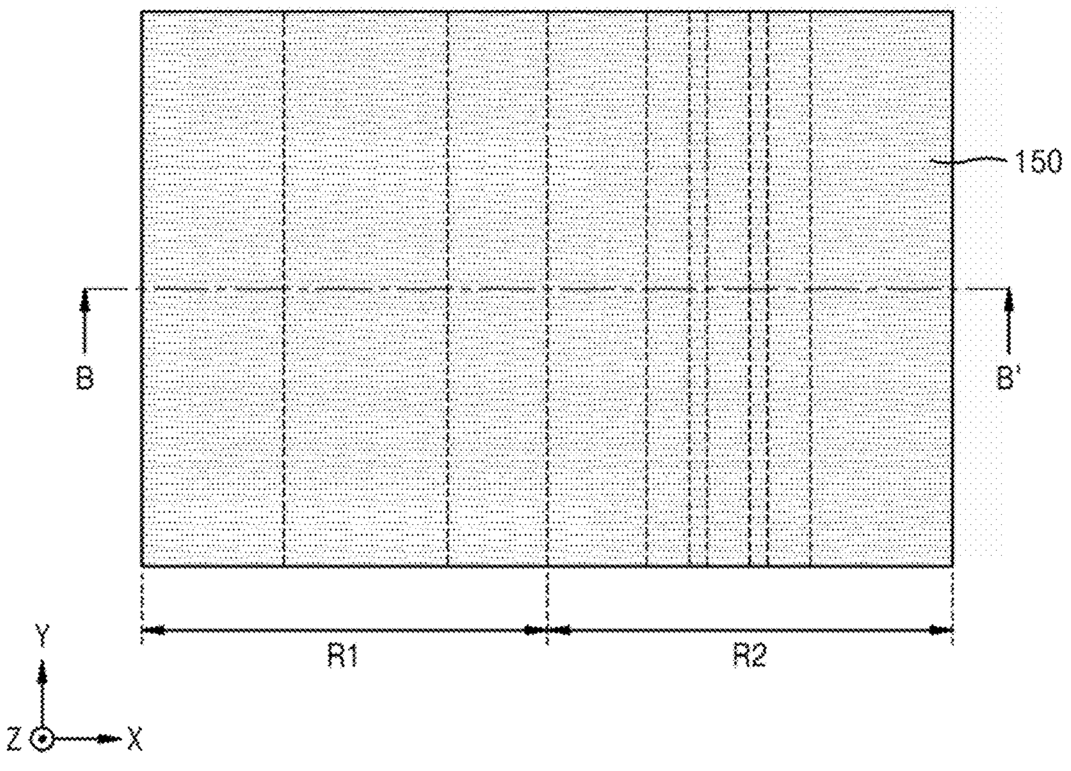
Figure 10B:
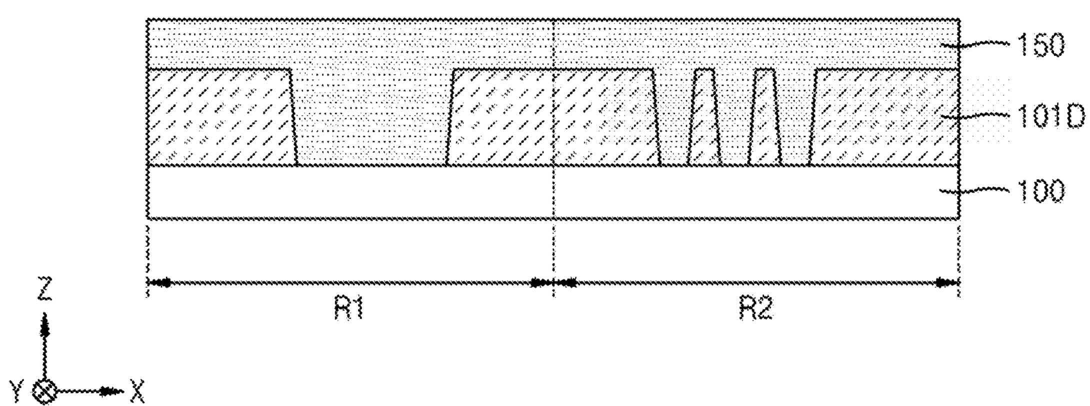

Referring to FIGS. 10A and 10B together, a conductive material layer 150 may fill the exposed surface of the substrate 100 and the entire surface of the final insulating pattern 101D. The conductive material layer 150 may be formed to a thickness sufficient to fill the wide opening 101W (see FIG. 9A) and the narrow opening 101N (see FIG. 8A) included in the final insulating pattern 101D and completely cover the final insulating pattern 101D.

The conductive material layer 150 may be copper (Cu) or a copper alloy. After forming a copper seed layer on the exposed surface of the substrate 100 and the final insulating pattern 101D, the conductive material layer 150 may be formed on the copper seed layer by performing electroplating. Alternatively, the conductive material layer 150 may include aluminum (Al), tungsten (W), titanium (Ti), tantalum (Ta), palladium (Pd), platinum (Pt), molybdenum (Mo), or a metal silicide.

Figure 11B:
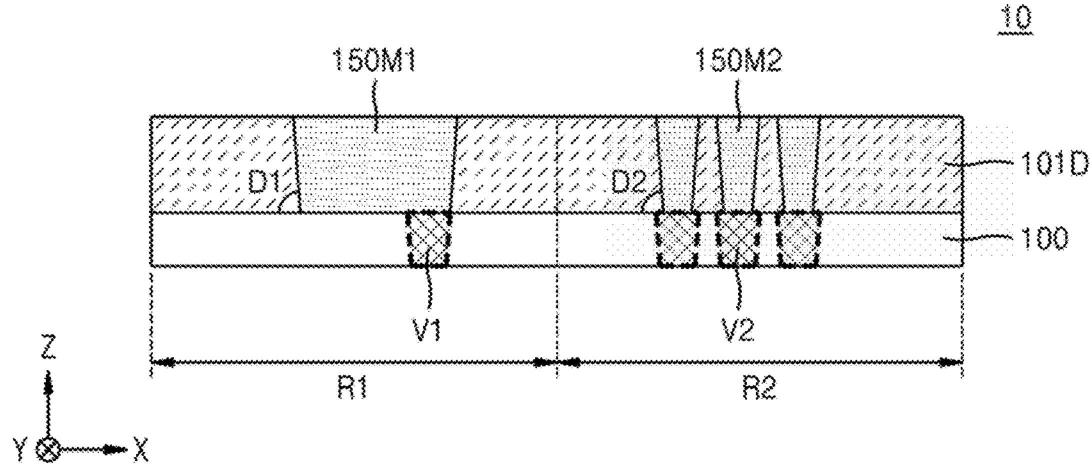

Referring to FIGS. 11A and 11B together, a polishing process may be performed on the conductive material layer 150 (see FIG. 10A) on the upper surface of the final insulating pattern 101D to form a plurality of conductive lines 150M1 and 150M2. The polishing process may be performed using the final insulating pattern 101D as an etch stop layer. Accordingly, the conductive material layer 150 (see FIG. 10A) may be planarized by the polishing process to expose the upper surface of the final insulating pattern 101D. In an implementation, the upper surfaces of the plurality of conductive lines 150M1 and 150M2 may be planarized with the upper surface of the final insulating pattern 101D. The plurality of conductive lines 150M1 and 150M2 may be electrically insulated from each other by the final insulating pattern 101D. In an implementation, the process of forming the plurality of conductive lines 150M1 and 150M2 may be performed as a damascene process.

The polishing process may be performed by a chemical mechanical polishing (CMP) process or an etch-back process. The polishing of the conductive material layer 150 (see FIG. 10A) may be performed under a condition in which etching of the final insulating pattern 101D may be suppressed. In an implementation, when the removal process is performed as a CMP process, etching of the final insulating pattern 101D may be suppressed by adjusting slurry, polishing pad, or polishing conditions.

By performing the polishing process, a plurality of conductive lines 150M1 and 150M2 having different widths in the first horizontal direction (X direction) may be formed on the substrate 100. In detail, the plurality of conductive lines 150M1 and 150M2 may include a wide conductive line 150M1 in the first region R1 and a narrow conductive line 150M2 in the second region R2.

Here, each of the wide conductive line 150M1 and the narrow conductive lines 150M2 may have a tapered shape that may narrow towards the substrate 100, and a first angle D1 between the outer wall of the wide conductive line 150M1 and the upper surface of the substrate 100 may be substantially equal to a second angle D2 between the outer wall of the narrow conductive line 150M2 and the upper surface of the substrate 100. Each of the wide conductive line 150M1 and the narrow conductive lines 150M2 having the tapered shape may be formed because both sidewalls of the wide opening 101W (see FIG. 9A) of the first region R1 may correspond to both sidewalls of the narrow opening 101N (see FIG. 8A) of the first region R1. As such, the semiconductor element pattern 10 may be implemented using the pattern forming method described with reference to FIGS. 2A to 11B.

As described below, as the width of the wide conductive line 150M1 increases, a halation issue may occur in which a difference between a width of an uppermost surface and a width of a lowermost surface of the wide conductive line 150M1 increases. However, as described above, when using the pattern formation method of the semiconductor device, there may be an effect of forming a high-density pattern in which the halation issue may be resolved while having an ultra-fine width and space by using a pattern of a size that may be implemented within the resolution limit of the photolithography process. In an implementation, the contact area between the plurality of vertical vias V1 and V2 formed on the substrate 100 and the plurality of conductive lines 150M1 and 150M2 may be maximized, and contact resistance may be remarkably reduced.

Figure 12:
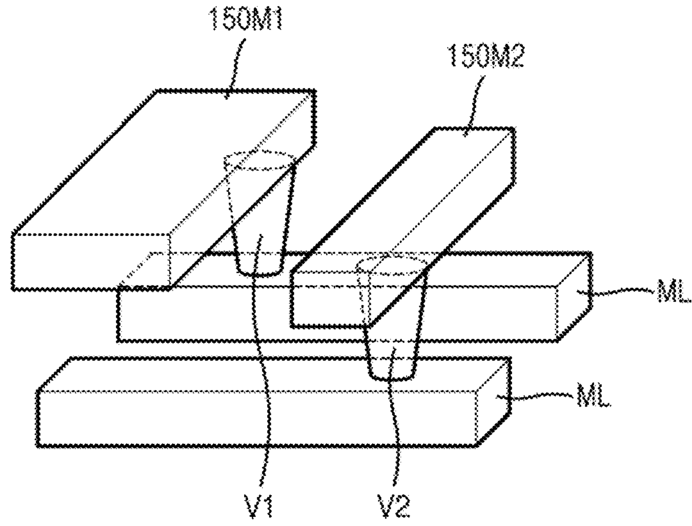
FIG. 12 is a perspective view showing an example embodiment of a multi-layered conductive line.

FIG. 12 is a perspective view showing an example embodiment of a multi-layered conductive line. Referring to FIG. 12, a plurality of vertical vias V1 and V2 electrically connecting the metal wiring line ML and the plurality of conductive lines 150M1 and 150M2 to each other are shown.

In an implementation, the plurality of conductive lines 150M1 and 150M2 and the plurality of vertical vias V1 and V2 should be formed as shown. It may not be easy to form such a structure due to various design variables and process variables in an actual semiconductor device manufacturing process.

In a process of forming the plurality of conductive lines 150M1 and 150M2 having different widths, the area of the plurality of vertical vias V1 and V2 could decrease due to the decrease in design rules, and considerable process technology could be used to increase the contact area between the plurality of conductive lines 150M1 and 150M2 and the plurality of vertical vias V1 and V2.

The method of forming a pattern of a semiconductor device may be used, each of the wide conductive line 150M1 and the narrow conductive line 150M2 may be formed in a tapered shape with substantially the same narrowing ratio, and the contact area with the plurality of vertical vias V1 and V2 may be relatively increased.

Figure 13:
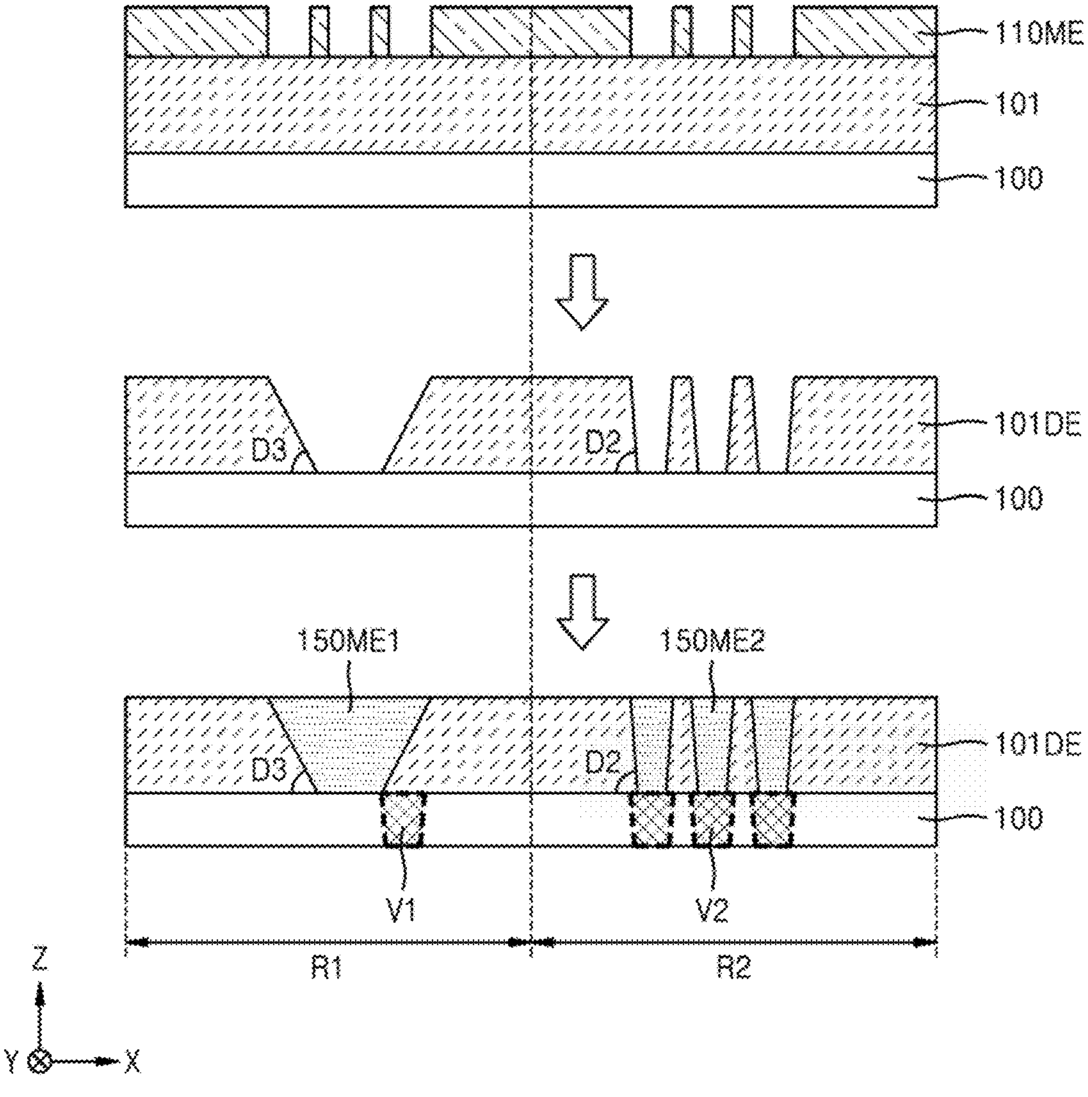
FIG. 13 is a cross-sectional view showing a comparative example of a conductive line.

FIG. 13 is a cross-sectional view showing a comparative example of a conductive line. Referring to FIG. 13, in the method of forming a pattern of a semiconductor device according to the comparative example, a lower mask pattern 110ME having a wide opening and a narrow opening may be formed.

Next, the insulating film 101, may be anisotropically etched using the lower mask pattern 110ME as an etching mask, thereby forming a final insulating pattern 101DE. In this case, in the wide opening of the final insulating pattern 101DE formed in the first region R1, a difference between a width of an uppermost surface and a width of a lowermost surface may be large.

Next, a wide conductive line 150ME1 may be formed in the first region R1 and a narrow conductive line 150ME2 may be formed in the second region R2. Here, the wide conductive line 150ME1 may be formed depending on the shape of the wide opening, and the narrow conductive line 150ME2 may be formed depending on the shape of the narrow opening.

A third angle D3 between the outer wall of the wide conductive line 150ME1 and the upper surface of the substrate 100 may be less than the second angle D2 between the outer wall of the narrow conductive line 150ME2 and the upper surface of the substrate 100.

In an implementation, as the width of the wide conductive line 150ME1 increases, a halation issue in which a difference between a width of an uppermost surface and a width of a lowermost surface of the wide conductive line 150ME1 increases may occur. Accordingly, a contact area between the vertical via V1 positioned on the substrate 100 and the wide conductive line 150ME1 may be reduced, which may cause a problem in that contact resistance becomes very large.

In order to efficiently address issues that could occur in the method of forming a pattern of a semiconductor device according to the comparative example, the method of forming a pattern of a semiconductor device according to an embodiment may be performed.

Figure 14:
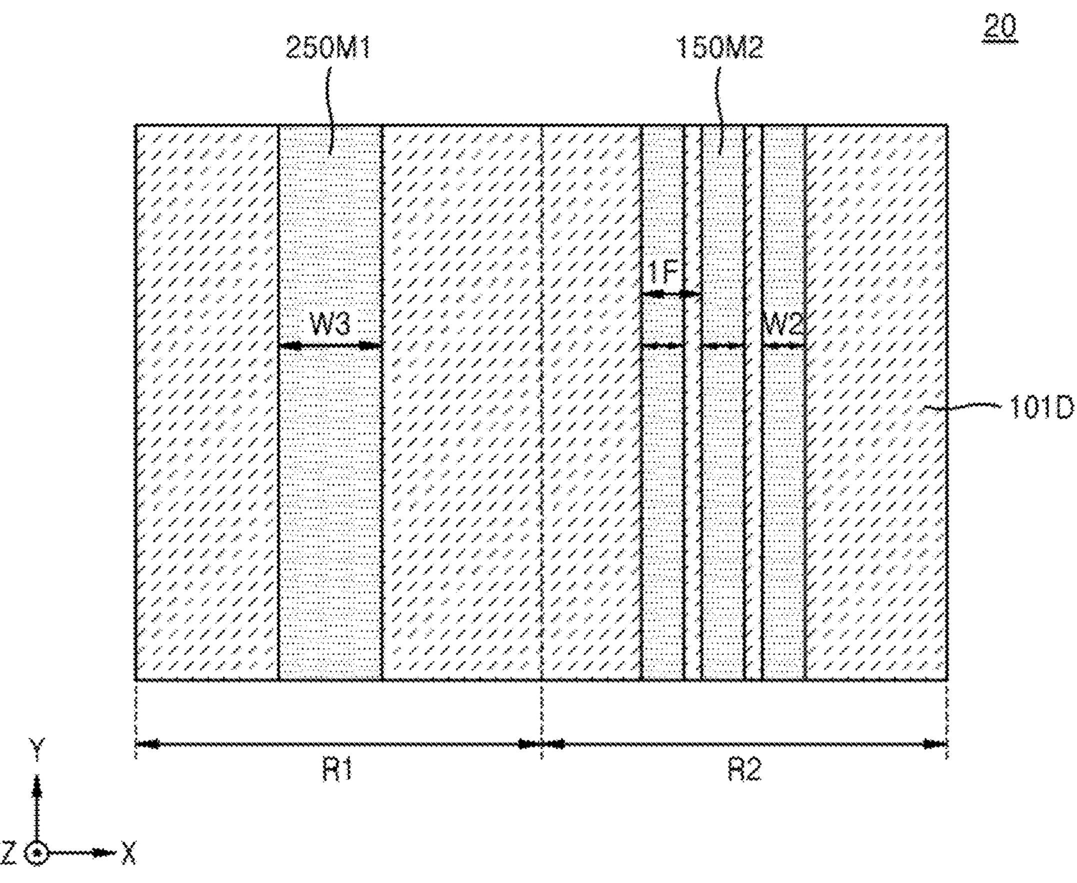
FIGS. 14 to 16 are plan views showing example embodiments of conductive lines of a semiconductor device.
Figure 15:
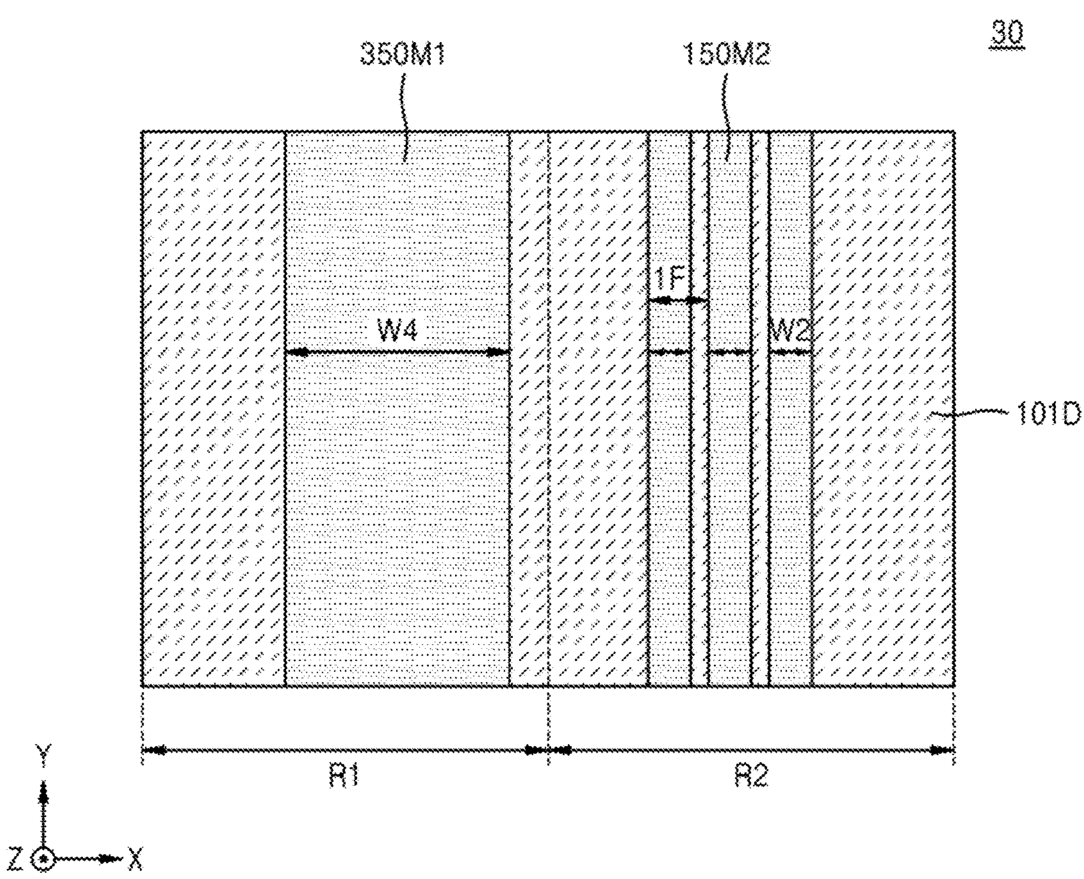
Figure 16:
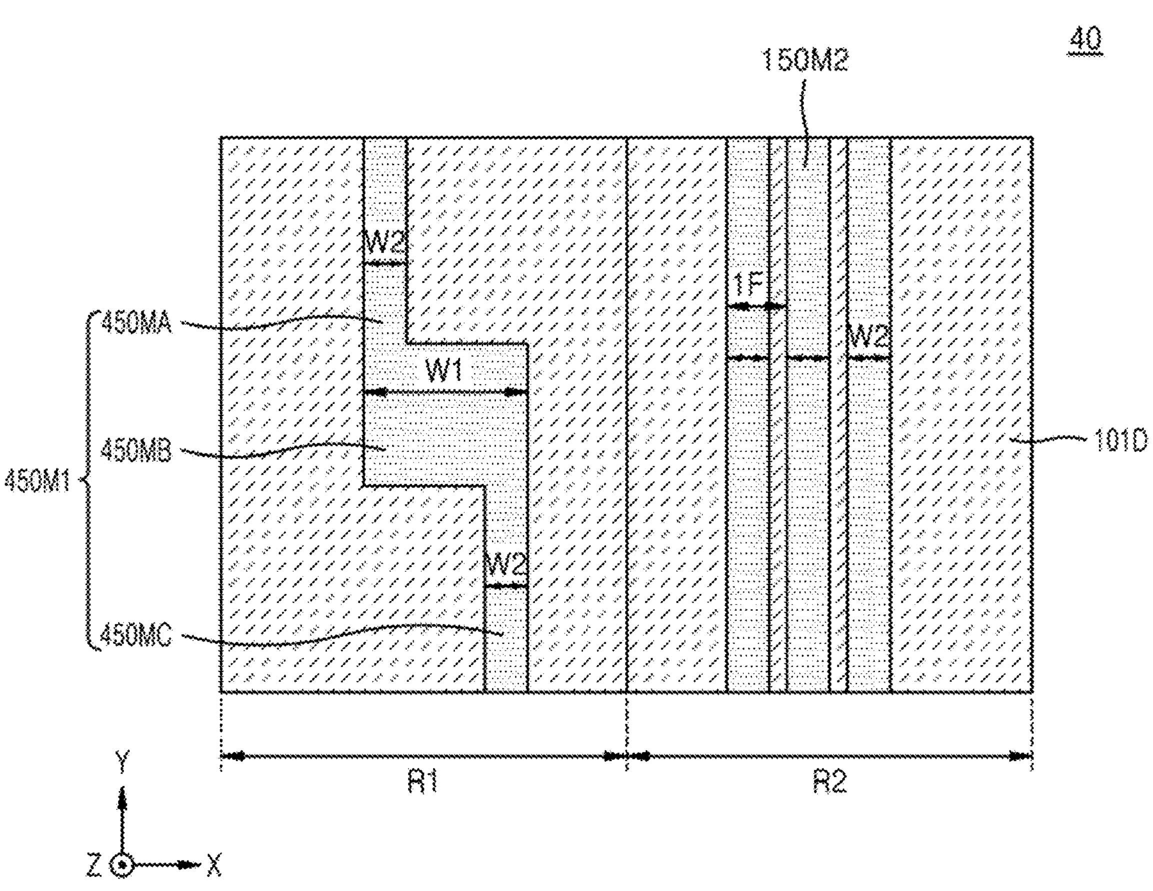

FIGS. 14 to 16 are plan views showing example embodiments of conductive lines of a semiconductor device. Most of the manufacturing processes and elements constituting the method of forming a pattern of a semiconductor device described below may be substantially the same as or similar to those previously described with reference to FIGS. 2A to 11B. Therefore, for convenience of description, description is made focusing on differences from the above-described method of forming a pattern of a semiconductor device.

Referring to FIGS. 14 and 15 together, the widths of the wide conductive lines 250M1 and 350M1 in the first region R1 may be less or greater based on a design rule of a conductive line to be finally formed.

The third width W3 of the wide conductive line 250M1 having a relatively small width in the semiconductor element pattern 20 (see FIG. 14) may be less than the first width W1 of the wide conductive line 150M1 (see FIG. 11A) as described above by the line-and-space width 1F.

Unlike this, a fourth width W4 of the wide conductive line 350M1 having a relatively large width in the semiconductor element pattern 30 (see FIG. 15) may be larger than the first width W1 of the wide conductive line 150M1 (see FIG. 11A) as described above by the line-and-space width 1F. In an implementation, based on the line-and-space width 1F of the narrow conductive line 150M2, the widths of the wide conductive lines 250M1 and 350M1 may increase or decrease by a multiple of the line-and-space width 1F.

Referring to FIG. 16, a conductive line 450M1 having a bent portion may be formed in the first region R1 by using the method of forming a pattern of a semiconductor device. The conductive line 450M1 having a bent portion in the first region R1 may include a pair of line patterns 450MA and 450MC and a bridge pattern 450MB which may extend in a first horizontal direction (X direction) perpendicular to the extension direction of the pair of line patterns 450MA and 450MC and may electrically connect the pair of line patterns 450MA and 450MC to each other.

Each of the pair of line patterns 450MA and 450MC may have the same width as the second width W2 of the narrow conductive lines 150M2 positioned in the second region R2, and the bridge pattern 450MB may have the same width as the first width W1 of the previously described wide conductive line 150M1 (see FIG. 11A).

The bridge pattern 450MB may contact one end of one line pattern 450MA of the pair of line patterns 450MA and 450MC and contact the other end of the other line pattern 450MC of the pair of line patterns 450MA and 450MC. In an implementation, the bridge pattern 450MB may correspond to a portion of the wide conductive line 150M1 (see FIG. 11A). By applying the pattern formation method as described above, the conductive line 450M1 having a bent portion may be formed in the first region R1 of the semiconductor device pattern 40.

Figure 17:
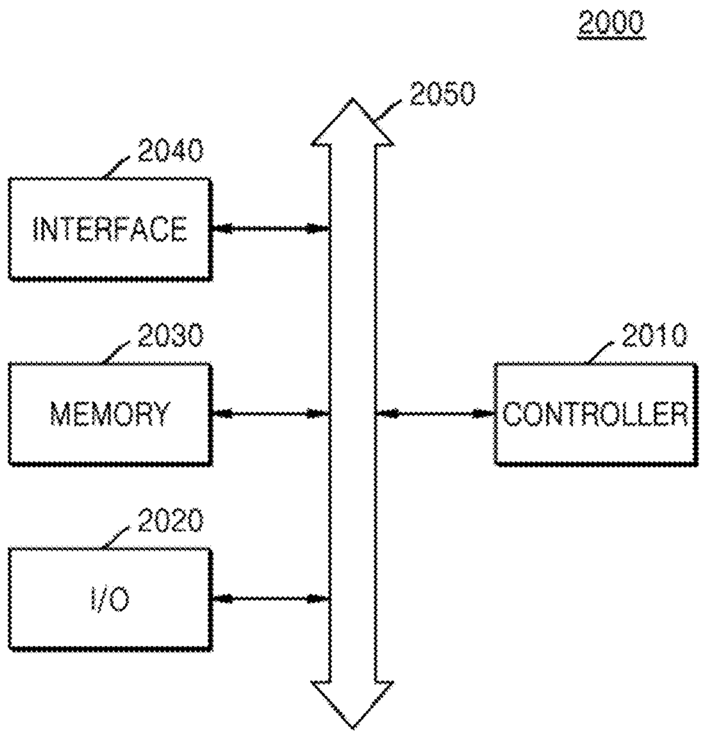
FIG. 17 is a configuration diagram showing an example embodiment of a communication system including a semiconductor device.

FIG. 17 is a configuration diagram showing an example embodiment of a communication system 2000 including a semiconductor device. Referring to FIG. 17, the communication system 2000 may include a controller 2010, an input/output device 2020, a storage device 2030, an interface 2040, and a bus 2050.

The communication system 2000 may be a mobile system or a system that transmits or receives information. In some embodiments, the mobile system may be a portable computer, tablet, mobile phone, digital music player, or memory card.

The controller 2010 may control the execution program of the communication system 2000, and may include a microprocessor, a digital signal processor, or a microcontroller. The input/output device 2020 may be used to input or output data from the communication system 2000. The communication system 2000 may be connected to an external device, e.g., a personal computer or a network, and may exchange data with the external device using the input/output device 2020. The input/output device 2020 may be, e.g., a touch pad, keyboard, or display.

The memory device 2030 may store data for operation of the controller 2010 or data processed by the controller 2010. The memory device 2030 may include a semiconductor device manufactured by the method of forming a pattern of a semiconductor device according to an embodiment described above.

The interface 2040 may be a data transmission path between the communication system 2000 and an external device. The controller 2010, the input/output device 2020, the storage device 2030, and the interface 2040 may communicate with each other via bus 2050.

By way of summation and review, a method of forming a pattern of a semiconductor device including high-density patterns having ultra-fine widths and intervals in a high-density region of the semiconductor device is disclosed. Technology capable of forming the fine pattern within the resolution limit of the existing photolithography process may be utilized, and a semiconductor device having a new fine pattern to which such technology may be applied may be utilized.

A method of forming a pattern of a semiconductor device is disclosed including a high-density pattern having an ultra-fine width and space and solving the halation issue using a pattern of a size that may be implemented within the resolution limit of the photolithography process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, or elements described in connection with a particular embodiment may be used singly or in combination with features, characteristics, or elements described in connection with other embodiments unless otherwise specifically indicated. Accordingly, it will be understood by those of skill in the art that various changes in form and details may be made.

What is claimed is:

1. A method of forming a pattern of a semiconductor device, the method comprising:

forming an insulating film on a substrate having a first region and a second region;

sequentially forming a lower mask layer and an upper mask layer on the insulating film;

forming a line-shaped hard mask pattern having a plurality of narrow openings having the same width in the first region and the second region, respectively, on the upper mask layer;

forming line-shaped spacers on sidewalls of the plurality of narrow openings of the line-shaped hard mask pattern;

forming a composite mask pattern composed of the spacer and a pattern having a first width among the line-shaped hard mask pattern by removing a pattern having a second width among the line-shaped hard mask patterns, the second width being smaller than the first width;

forming a lower mask pattern by sequentially etching the upper mask layer and the lower mask layer using the composite mask pattern as an etch mask;

etching the insulating film using the lower mask pattern as an etching mask into a line-shaped insulating pattern having the same plurality of narrow openings in each of the first region and the second region;

forming a wide opening by removing a pattern having a third width among the line-shaped insulating patterns in the first region, and maintaining the plurality of narrow openings of the line-shaped insulating pattern in the second region;

forming a conductive material layer filling the wide opening and the plurality of narrow openings of the line-shaped insulating pattern; and polishing the conductive material layer into a wide conductive line in the first region and a narrow conductive line in the second region.

2. The method as claimed in claim 1, wherein:

the wide conductive line and the narrow conductive line each have a tapered shape in which the width narrows towards the substrate, and a first angle between an outer wall of the wide conductive line and an upper surface of the substrate is substantially equal to a second angle between the outer wall of the narrow conductive line and the upper surface of the substrate.

3. The method as claimed in claim 1, wherein, in the first region, the wide opening is formed by removing a line-shaped insulating spacer pattern between the plurality of narrow openings.

4. The method as claimed in claim 3, wherein:

a first sidewall of the wide opening is located at a first outermost part of the plurality of narrow openings, and a second sidewall of the wide opening is located at a second outermost part of the plurality of narrow openings.

5. The method as claimed in claim 3, wherein the third width of the wide opening is determined by the number of removed line-shaped insulating spacer patterns between the plurality of narrow openings.

6. The method as claimed in claim 5, wherein the third width of the wide opening increases or decreases as a multiple of a line-and-space width of the plurality of narrow openings.

7. The method as claimed in claim 1, wherein the forming of the spacer includes:

forming a preliminary spacer layer conformally covering the upper mask layer and the line-shaped hard mask pattern; and performing an entire surface etching process on the preliminary spacer layer.

8. The method as claimed in claim 7, wherein the material constituting the composite mask pattern is a dissimilar material having different etching selectivity from the pattern having the second width among the line-shaped hard mask patterns.

9. The method as claimed in claim 1, wherein the forming of the conductive material layer is performed by a damascene process.

10. The method as claimed in claim 1, wherein a conductive vertical via is under the wide conductive line.

11. A method of forming a pattern of a semiconductor device, the method comprising:

forming an insulating film on a substrate;

forming a lower mask layer on the insulating film;

forming a line-shaped hard mask pattern having an opening on the lower mask layer;

forming line-shaped spacers on sidewalls of the opening of the line-shaped hard mask pattern;

forming a composite mask pattern composed of the spacer and a pattern having a first width among the line-shaped hard mask patterns by removing a pattern having a second width among the line-shaped hard mask patterns, the second width being smaller than the first width;

forming a lower mask pattern by etching the lower mask layer using the composite mask pattern as an etch mask;

forming a line-shaped insulating pattern with a plurality of narrow openings each having a same fourth width by etching the insulating film using the lower mask pattern as an etching mask;

forming a wide opening by removing a pattern having a third width among the line-shaped insulating patterns;

forming a conductive material layer filling the wide opening of the line-shaped insulating pattern; and polishing the conductive material layer into a wide conductive line.

12. The method as claimed in claim 11, wherein:

the wide conductive line has a tapered shape that narrows towards the substrate, and a first angle between an outer wall of the wide conductive line and an upper surface of the substrate is substantially equal to a second angle between the side wall of the plurality of narrow openings and the upper surface of the substrate.

13. The method as claimed in claim 11, wherein:

the wide opening is formed by removing a line-shaped insulating spacer pattern between the plurality of narrow openings, and the third width of the wide opening is determined by the number of removed insulating spacer patterns.

14. The method as claimed in claim 13, wherein the insulating spacer pattern has a tapered shape that widens towards the substrate.

15. The method as claimed in claim 13, wherein the third width of the wide opening is at least twice the fourth width of each of the plurality of narrow openings.

16. A method of forming a pattern of a semiconductor device, the method comprising:

forming an insulating film on a substrate;

forming a lower mask layer on the insulating film;

forming a line-shaped hard mask pattern having an opening on the lower mask layer;

forming line-shaped spacers on sidewalls of the opening of the line-shaped hard mask pattern;

forming a composite mask pattern composed of the spacer and a pattern having a first width of the line-shaped hard mask patterns by removing a pattern having a second width among the line-shaped hard mask patterns, the second width being smaller than the first width;

forming a lower mask pattern by etching the lower mask layer using the composite mask pattern as an etch mask;

forming a line-shaped insulating pattern having a plurality of narrow openings by etching the insulating film using the lower mask pattern as an etching mask;

forming a wide opening between the plurality of narrow openings by removing a pattern having a third width among the line-shaped insulating patterns;

forming a conductive material layer filling the plurality of narrow openings and the wide opening of the line-shaped insulating pattern; and polishing the conductive material layer into a conductive line having a bent portion at a location of the wide opening.

17. The method as claimed in claim 16, wherein the conductive line includes:

a pair of line patterns in the plurality of narrow openings; and a bridge pattern in the wide opening, extending perpendicularly to an extension direction of the pair of line patterns, and electrically connecting the pair of line patterns.

18. The method as claimed in claim 17, wherein:

the conductive line has a tapered shape that narrows in width towards the substrate, and a first angle between outer walls of the pair of line patterns and an upper surface of the substrate is substantially equal to a second angle between outer walls of the bridge pattern and the upper surface of the substrate.

19. The method as claimed in claim 17, wherein the bridge pattern contacts one end of one of the pair of line patterns and contacts another end of the other one of the pair of line patterns.

20. The method as claimed in claim 16, wherein:

the wide opening is formed by removing an insulating spacer pattern between the plurality of narrow openings, and the third width of the wide opening is determined by the number of removed insulating spacer patterns.

* * * * *